United States Patent [19]
Gotoh et al.

[11] Patent Number: 5,525,855
[45] Date of Patent: Jun. 11, 1996

[54] FLAT PACKAGED PIEZOELECTRIC DEVICE USING A GLASS-CERAMIC COMPOSITE MATERIAL COMPRISING FORSTERITE AS CERAMICS

[75] Inventors: Yoshihiro Gotoh; Yoshinobu Mikazuki; Yasutoshi Morisaki, all of Shiga, Japan

[73] Assignee: NEC Corporation, Tokyo, Japan

[21] Appl. No.: 527,256

[22] Filed: Sep. 12, 1995

Related U.S. Application Data

[62] Division of Ser. No. 146,575, Oct. 29, 1993, abandoned.

[30] Foreign Application Priority Data

Oct. 29, 1992 [JP] Japan .................. 4-291108
Jun. 18, 1993 [JP] Japan .................. 5-147184

[51] Int. Cl.⁶ .................. H01L 41/04; H01L 41/08; H01L 41/18; C03C 1/00
[52] U.S. Cl. .................. 310/344; 310/348; 310/358; 501/32; 252/629 R
[58] Field of Search .................. 501/32; 252/62.9; 310/348, 344, 358

[56] References Cited

U.S. PATENT DOCUMENTS

| | | | |
|---|---|---|---|
| 3,796,968 | 3/1974 | Luscher | 331/67 |
| 4,266,156 | 5/1981 | Kizaki | 310/344 |
| 4,362,961 | 12/1982 | Gerber | 310/370 |
| 4,405,875 | 9/1983 | Nagai | 310/344 |
| 4,593,006 | 6/1986 | Takabatake et al. | 501/32 |
| 4,639,631 | 1/1987 | Chason et al. | 310/348 |
| 4,654,095 | 3/1987 | Steinberg | 501/15 |
| 4,655,864 | 4/1987 | Rollick | 501/15 |
| 4,777,092 | 10/1988 | Kowakami et al. | 501/32 |
| 4,883,705 | 11/1989 | Kawakomi et al. | 501/32 |
| 5,179,047 | 1/1993 | Chiba | 501/32 |
| 5,242,867 | 9/1993 | Lin et al. | 501/32 |
| 5,430,345 | 7/1995 | Takahashi | 310/348 |

*Primary Examiner*—Karl Group
*Assistant Examiner*—Louis M. Troilo

[57] ABSTRACT

A crystal oscillator unit which serves as a flat packaged piezoelectric device includes a base member, a quartz piece, and a cap member sealed air-tight to the base member to enclose the quartz piece in cooperation with the base member. Each of the base and the cap members is made of a glass-ceramic composite material in which 30 to 70% by weight of forsterite is dispersed in glass and which has a thermal expansion coefficient between $100 \times 10^{-7}/°C$. and $150 \times 10^{-7}/°C$. The glass consists, in percent by weight, essentially of 50 to 70% of $SiO_2$, 3 to 15% of $Al_2O_3$, 0 to 10% of $ZnO$, 0 to 8% of $B_2O_3$, 7 to 25% of at least one member of $CaO$, $SrO$, and $BaO$, and 13 to 27% of at least one member of $Na_2O$, $K_2O$, and $Li_2O$. The glass and the forsterite are pulverized to an average particle diameter of 1 to 3 microns, mixed together with addition of fine powder of an average particle diameter of 0.1 to 1 micron of 0 to 5% by weight of at least one member of $ZrO_2$, $TiO_2$, $SnO_2$, $P_2O_5$, and $MoO_3$, and sintered at a temperature between 800° C. and 1000° C.

7 Claims, 3 Drawing Sheets

FLAT PACKAGED PIEZOELECTRIC DEVICE USING A GLASS-CERAMIC COMPOSITE MATERIAL COMPRISING FORSTERITE AS CERAMICS

CROSS-REFERENCE TO RELATED APPLICATION

This application is a division of application Ser. No. 08/146,575 filed Oct. 29, 1993, now abandoned.

BACKGROUND OF THE INVENTION

This invention relates to a glass-ceramic composite material for use in a flat packaged piezoelectric device. This invention relates also to the flat packaged piezoelectric device.

A flat packaged piezoelectric device of the type described is, for example, a crystal oscillator unit or an SAW (surface acoustic wave) resonator unit and is for use in surface mounting.

A conventional flat packaged piezoelectric device comprises a base member, a pair of electrode pad parts formed on the base member, and a piezoelectric oscillator piece of, for example, a quartz piece. A pair of electrodes are formed on both surfaces of the piezoelectric oscillator piece and have parts fixed to the electrode pad parts. A cap member is sealed air-tight to the base member to enclose the piezoelectric oscillator piece in cooperation with the base member.

As will later be described, the piezoelectric oscillator piece and the base and the cap members have a difference in thermal expansion coefficients. This gives rise to a strain after cooling down from a raised temperature to result in a variation in the resonance frequency of the crystal oscillator unit and to make it impossible to attain a desired frequency characteristic.

Moreover, use of a resilient supporter as intermediary for connection of the piezoelectric oscillator piece to the base and the cap members in solving the above-described problem, results in other problems, such as an increased manufacturing cost and a thicker thickness of the flat packaged piezoelectric device as will also later be described.

Still further, alumina ($Al_2O_3$) for use as a principal material of each of the base and the cap members must be sintered at a temperature of 1500° to 1600° C. As a consequence, internal conductors for wiring in the flat packaged piezoelectric device must be made of tungsten (W), molybdenum (Mo), and a like metal having a high melting point if the conductors should concurrently be sintered. Such a metal of the high melting point has a low electric conductivity and is not adapted to soldering. Nickel (Ni) plating and/or gold (Au) plating are therefore indispensable. As a result, great amounts of process and cost are necessary on manufacture.

SUMMARY OF THE INVENTION

It is therefore an object of this invention to provide a glass-ceramic composite material used in a flat packaged piezoelectric device, which material makes it possible to attain a desired frequency characteristic of the flat packaged piezoelectric device.

It is another object of this invention to provide a glass-ceramic composite material of the type described, which can be manufactured by a reduced amount of process and at a low cost.

It is a further object of this invention to provide a flat packaged piezoelectric device which can attain a desired frequency characteristic.

It is a still further object of this invention to provide a flat packaged piezoelectric device of the type described, which has a decreased manufacturing cost.

Other objects of this invention will become clear as the description proceeds.

According to an aspect of this invention, there is provided a glass-ceramic composite material comprising a glass component and a ceramic component. The glass component has a thermal expansion coefficient between $100\times10^{-7}$/°C. and $150\times10^{-7}$/°C., both inclusive. The ceramic component is 30 to 70% by weight of forsterite ($2MgO.SiO_2$) which is dispersed in the glass component.

A flat packaged piezoelectric device to which this invention is applicable comprises a base member, a pair of electrode pad parts formed on the base member, a piezoelectric oscillator piece, a pair of electrodes formed on both surfaces of the piezoelectric oscillator piece and having parts fixed to the electrode pad parts, and a cap member sealed air-tight to the base member to enclose the piezoelectric oscillator piece in cooperation with the base member. According to another aspect of this invention, each of the base and the cap members is made of a glass-ceramic composite material comprising a glass component and a ceramic component. The glass component has a thermal expansion coefficient between $100\times10^{-7}$/°C. and $150\times10^{-7}$/°C., both inclusive. The ceramic component is 30 to 70% by weight of forsterite ($2MgO.SiO_2$) which is dispersed in the glass component.

According to the invention each of the base and the cap members is formed of a material having a thermal expansion coefficient similar to that of a piezoelectric oscillator piece, such as a quartz piece, so that the piezoelectric oscillator piece may be fixed directly to the package without intermediary of a supporting member. As the material for the base and the cap members, a composite material of a ceramic component and a glass component is used wherein 30 to 70% by weight of forsterite is dispersed in the glass component.

The glass component preferably consists essentially of 50 to 70% by weight of $SiO_2$, 3 to 15% by weight of $Al_2O_3$, 0 to 10% by weight of ZnO, 7 to 25% by weight of RO (where RO represents at least one member of CaO, SrO, and BaO), 0 to 8% by weight of $B_2O_3$, and 13 to 27% by weight of $R_2O$ (where $R_2O$ represents at least one member of $Na_2O$, $K_2O$, and $Li_2O$).

For improving a bend breakage strength to a desired value, the glass component and the forsterite are pulverized into sufficiently fine powder of an average particle diameter between 1 and 3 microns. For further improvement of the bend breakage strength, an additive of 0 to 5% by weight of at least one member of $ZrO_2$, $TiO_2$, $SnO_2$, $P_2O_5$, and $MoO_3$ is mixed so that the glass is caused to at least partly crystallize during sintering or firing to have a raised bend breakage strength.

As a result of the foregoing, the material of the base and the cap members matches the piezoelectric oscillator piece in their thermal expansion coefficients to reduce a residual strain after cooling down from a raised temperature and to suppress a variation in the resonance frequency. Moreover, a sufficient bend breakage strength is achieved.

It is possible to lower the sintering temperature of the package and to use Ag, Ag/Pd, Ag/Au, or a like metal of a low melting point even while the internal conductors are simultaneously sintered. These metal materials have a high electric conductivity. Selection of a component ratio in the internal conductors enables to carry out soldering and to do without plating processes.

As a consequence, it is rendered possible to provide a flat packaged piezoelectric device in which a piezoelectric oscillator piece is less subjected to a variation in its resonance frequency and which is thinner in thickness and more highly reliable than ever. In addition, it is possible to reduce the cost of manufacture and to shorten hours of manufacture.

DESCRIPTION OF THE PREFERRED EMBODIMENTS

Figure 1:
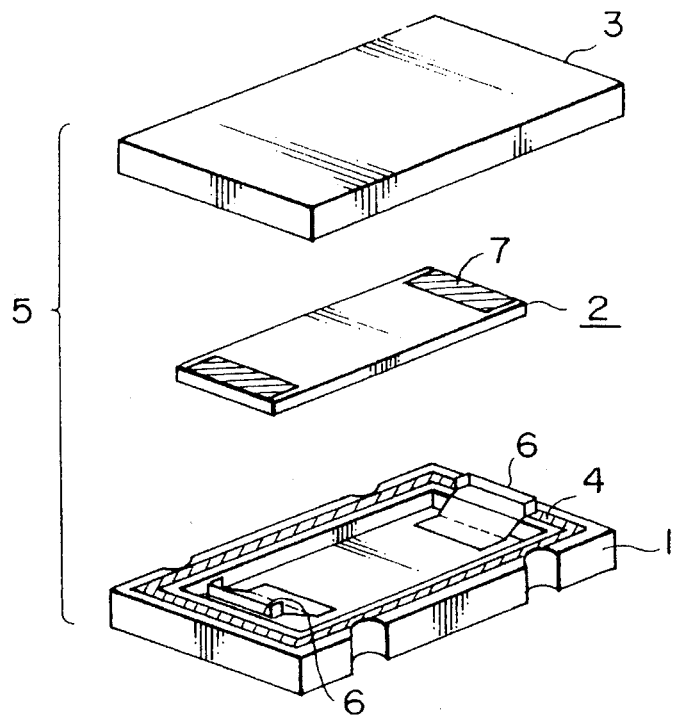
FIG. 1 is an exploded perspective view of a conventional crystal oscillator unit.

Referring to FIG. 1, a conventional crystal oscillator unit which serves as a flat packaged piezoelectric device, will first be described for a better understanding of this invention.

In FIG. 1, the crystal oscillator unit is for use in surface mounting and comprises a quarts piece 2 fixed to a base member 1 made principally of alumina. Subsequently, a cap member 3, made principally of alumina, is used as a cover and with air-tight seal achieved by a sealing part 4 of glass of a low melting point. A sealed package 5 is mounted on a circuit base board (not shown) by reflow soldering or a similar method. On sealing the package and mounting it onto the circuit base board, the package is heated to a raised temperature. It is to be noted in this connection that the package 5 and the quarts piece 2 have a difference in thermal expansion coefficients. This results in a strain in the quartz piece 2 after cooled down from the raised temperature to give rise to a variation in the resonance frequency of the quartz piece 2 and to make it impossible to attain a desired frequency characteristic. As a countermeasure, a periodical published in the Japanese language under the title of "Electronics Update", 1990.4, teaches on pages 83 to 88, the structure which is illustrated in FIG. 1 and in which the quartz piece 2 is fixed to the base member 2 by intermediary of a resilient supporter 6 for subsequent air-tight seal.

Figure 2:
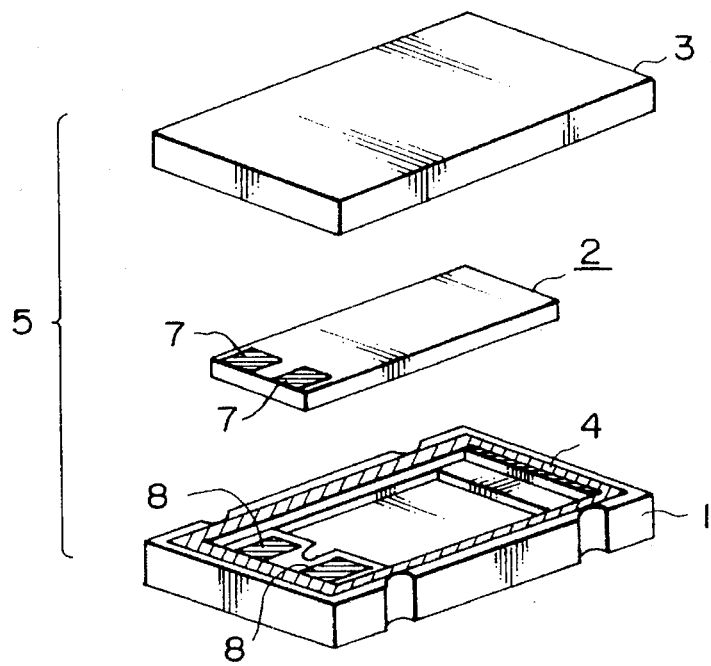
FIG. 2 is an exploded perspective view of another conventional crystal oscillator unit.

As depicted in FIG. 2, another conventional crystal oscillator unit is proposed in Pat. Prepub. (A) No. 105,710 of 1990 as follows. Electrode lead parts 7 for the quartz piece 2 are led from a common end of the quartz piece 2 with the quartz piece 2 fixed, without intermediary of a supporter, directly to electrode pad parts 8 formed on the base member 1. Being fixed to the electrode pad parts 8 only at the common end, the quartz piece 2 has a free end and is not subjected to the strain.

In the crystal oscillator units illustrated in FIGS. 1 and 2, the package 5 and the quartz piece 2 have a difference in thermal expansion coefficients. This gives rise to a strain after cooling down from a raised temperature to result in a variation in the resonance frequency of the crystal oscillator unit and to make it impossible to attain a desired frequency characteristic as described above.

Moreover, use of the resilient supporter 6 as intermediary for connection of the quartz piece 2 to the package 5 in solving the above-described problem, results in other problems, such as an increased manufacturing cost and a thicker thickness of the package 5 as also described above.

Still further, alumina ($Al_2O_3$) for use as a principal material of the package 5 must be sintered at a temperature of 1500° to 1600° C. As a consequence, internal conductors for wiring in the package 5 must be made of tungsten (W), molybdenum (Mo), and a like metal having a high melting point if the conductors should concurrently be sintered. Such a metal of the high melting point has a low electric conductivity and is not adapted to soldering. Nickel (Ni) plating and/or gold (Au) plating are therefore indispensable. As a result, great amounts of process and cost are necessary on manufacture as also mentioned before.

Embodiments and examples of this invention will now be described in detail by referring to Tables 1 and 2 and to FIGS. 3 through 5.

TABLE 1

| Example | Glass components (percent by weight) | | | | | |
|---|---|---|---|---|---|---|
| | $SiO_2$ | $Al_2O_3$ | ZnO | $B_2O_3$ | RO | $R_2O$ |
| 1(A) | | | | | | |
| 1 | 63 | 3 | 1 | 0 | 11 | 22 |
| 1(B) | | | | | | |
| 1(C) | | | | | | |
| 1(D) | | | | | | |
| 2(A) | | | | | | |
| 2 | 70 | 4 | 5 | 0.5 | 7.5 | 13 |
| 2(B) | | | | | | |
| 2(C) | | | | | | |
| 2(D) | | | | | | |
| 3(A) | | | | | | |
| 3 | 55 | 3 | 10 | 8 | 7 | 17 |
| 3(B) | | | | | | |
| 3(C) | | | | | | |
| 3(D) | | | | | | |

| | Composite ratio (percent by weight) | | | Characteristics | |
|---|---|---|---|---|---|
| | | | | Thermal expansion coefficient | Bend breakage |
| Example | Glass | Forsterite | $ZrO_2$ | ($\times 10^{-7}$/°C.) (50 to 500° C.) | strength ($kg/cm^2$) |
| 1(A) | 50 | 50 | 0 | 120 | 1800 |
| 1 | 49.5 | 49.5 | 1.0 | 118 | 3200 |
| 1(B) | 47.5 | 47.5 | 5.0 | 115 | 2900 |
| 1(C) | 69 | 30 | 1.0 | 129 | 2500 |
| 1(D) | 29 | 70 | 1.0 | 106 | 2800 |
| 2(A) | 50 | 50 | 0 | 103 | 1950 |
| 2 | 49.5 | 49.5 | 1.0 | 100 | 3100 |
| 2(B) | 49.0 | 49.0 | 2.0 | 97 | 2700 |
| 2(C) | 64.5 | 34.5 | 1.0 | 105 | 2380 |
| 2(D) | 34.5 | 64.5 | 1.0 | 100 | 2550 |
| 3(A) | 50 | 50 | 0 | 108 | 1850 |
| 3 | 49.5 | 49.5 | 1.0 | 104 | 3050 |
| 3(B) | 49.0 | 49.0 | 2.0 | 101 | 2520 |
| 3(C) | 64.5 | 34.5 | 1.0 | 102 | 2210 |
| 3(D) | 34.5 | 64.5 | 1.0 | 100 | 2410 |

TABLE 2

| Example | Glass components (percent by weight) | | | | | |
|---|---|---|---|---|---|---|
| | $SiO_2$ | $Al_2O_3$ | ZnO | $B_2O_3$ | RO | $R_2O$ |
| 4(A) | | | | | | |
| 4 | 50 | 3 | 5 | 0 | 25 | 17 |
| 4(B) | | | | | | |
| 4(C) | | | | | | |
| 4(D) | | | | | | |
| 5(A) | | | | | | |
| 5 | 55 | 3 | 5 | 0 | 10 | 27 |
| 5(B) | | | | | | |
| 5(C) | | | | | | |
| 5(D) | | | | | | |
| 6(A) | | | | | | |
| 6 | 50 | 15 | 0 | 0 | 12 | 23 |
| 6(B) | | | | | | |
| 6(C) | | | | | | |
| 6(D) | | | | | | |

| Example | Composite ratio (percent by weight) | | | Characteristics | |
|---|---|---|---|---|---|
| | Glass | Forsterite | $ZrO_2$ | Thermal expansion coefficient ($\times 10^{-7}/°C$) (50 to 500° C.) | Bend breakage strength ($kg/cm^2$) |
| 4(A) | 50 | 50 | 0 | 118 | 1800 |
| 4 | 49.5 | 49.5 | 1.0 | 116 | 3150 |
| 4(B) | 49.0 | 49.0 | 2.0 | 115 | 3000 |
| 4(C) | 64.5 | 34.5 | 1.0 | 126 | 2550 |
| 4(D) | 34.5 | 64.5 | 1.0 | 105 | 2730 |
| 5(A) | 50 | 50 | 0 | 123 | 1600 |
| 5 | 49.5 | 49.5 | 1.0 | 121 | 2800 |
| 5(B) | 49.0 | 49.0 | 2.0 | 120 | 2600 |
| 5(C) | 64.5 | 34.5 | 1.0 | 135 | 2300 |
| 5(D) | 34.5 | 64.5 | 1.0 | 112 | 2450 |
| 6(A) | 50 | 50 | 0 | 120 | 1650 |
| 6 | 49.5 | 49.5 | 1.0 | 119 | 3050 |
| 6(B) | 49.0 | 49.0 | 2.0 | 117 | 2950 |
| 6(C) | 64.5 | 34.5 | 1.0 | 128 | 2420 |
| 6(D) | 34.5 | 64.5 | 1.0 | 108 | 2750 |

In the glass compositions of Tables 1 and 2, RO represents at least one oxide selected from CaO, SrO, and BaO. $R_2O$ represents at least one oxide selected from $Na_2O$, $K_2O$, and $Li_2O$.

Glass, ceramics (forsterite), and an additive (zirconia) of Table 1 were first ground and mixed in a wet ball mill, dried to have an average particle diameter between 1 and 3 microns, machine-pestled, powder-mold pressed, and sintered or fired at a temperature between 800° C. and 1000° C. With a rectangular parallelopiped thereafter cut out, the band breakage strength and the thermal expansion coefficient were measured. The results are given in Table 1 and prove that a large thermal expansion coefficient of about 100 to $140 \times 10^{-7}/°C$. was achieved by a mixture of fine powder of glass and forsterite according to this invention and that addition of zirconia raises the bend breakage strength to more than 2200 $kg/cm^2$ and, depending on the composition, even more than 3000 $kg/cm^2$. It has been confirmed by results of differential thermal analysis and X-ray diffraction that a material sintered with addition of zirconia was partially crystallized. It appears that zirconia serves as an agent for providing seeds of crystallization.

In order next to study characteristics of packages for use as crystal oscillator units, the crystal oscillator units were manufactured to have the structure depicted in FIG. 3 as a first embodiment of this invention by using material powder given in Example 1 or Example 1(A) of Table 1 and by manufacturing processes specified in the following.

(a) A slurry was prepared by mixing the above-mentioned material, a binder of, for example, polyvinyl butyral, and a solvent of, for example, 2-methoxyethanol. A first green sheet of a thickness between 100 and 300 microns was manufactured by the doctor blade method.

(b) Through-holes (not shown) were formed through the first green sheet of (a). Silver (Ag) paste was screen printed to fill the through-holes and to provide internal conductors (not shown).

(c) Ag/Pd paste was screen printed on a second green sheet to provide electrode lead-out parts (not shown).

(d) Sets of rectangular holes were punched through the second green sheet, each set as a cavity for the quartz piece 2.

(e) In the manner which will presently be described, the first and the second green sheets and a dummy green sheet were stacked and hot-pressed at 100° C. and under a pressure between 100 and 200 $kg/cm^2$.

(f) The above-mentioned laminate was debindered and then sintered at a temperature between 800° C. and 1000° C.

Figure 3:
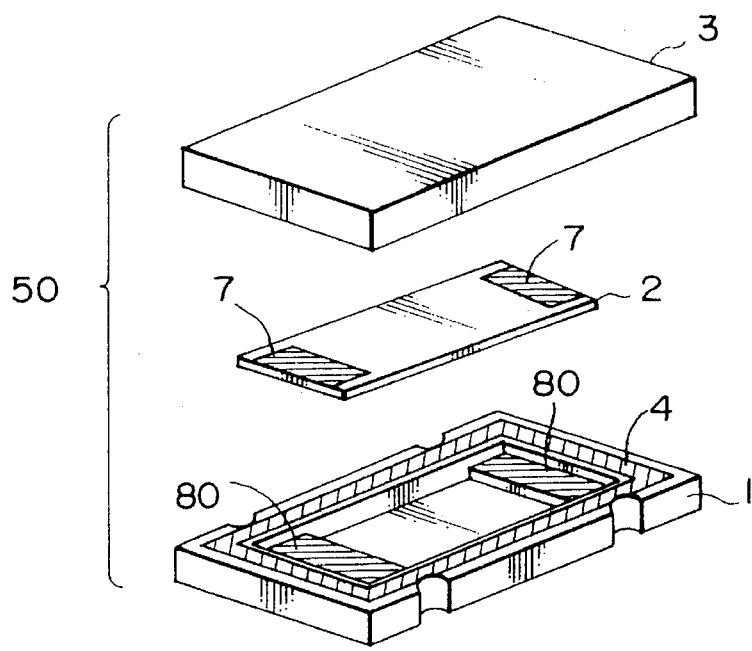
FIG. 3 is an exploded perspective view of a crystal oscillator unit according to a first embodiment of this invention.

(g) The sintered laminate was cut into pieces, each for use as a base member 1 of a package 50 shown in FIG. 3.

(h) Mixed powder, used for the base member 1, was shaped by powder pressing and sintered at 800° C. to 1000° C. to provide a cap member 3 of the package 50.

(i) A sealing part 4 was preliminarily formed on the base member 1 by using known glass of a low melting point. Into the structure depicted in FIG. 3, electrode pad parts 80 formed on the base member 1 and electrode lead parts 7 of the quartz piece 2 were fixed to the base member 1 by a known electrically conductive adhesive. Subsequently, the cap member 3 was sealed by using the sealing part 4 to complete a flat packaged crystal oscillator unit.

In order to compare with a prior-art manufacture, the crystal oscillator unit of this invention was tested as regards how the resonance frequency was dependent on the temperature of thermal treatment. Forty crystal oscillator units were manufactured. First, their resonance frequency (f0) was measured by a spectrum analyzer. Next, ten-unit sets were subjected to heat treatment at 100° C., 200° C., 300° C., and 400° C. for thirty minutes and then cooled down to room temperature. Their resonance frequencies (f(T)) were measured. Equation 1 was used to calculate Δf/f0.

$$\Delta f/f0 = (f(T) - f0)/f0,$$

namely, (the resonance frequency after the heat treatment minus the resonance frequency before the heat treatment)/ (the resonance frequency before the heat treatment).

Figure 4:
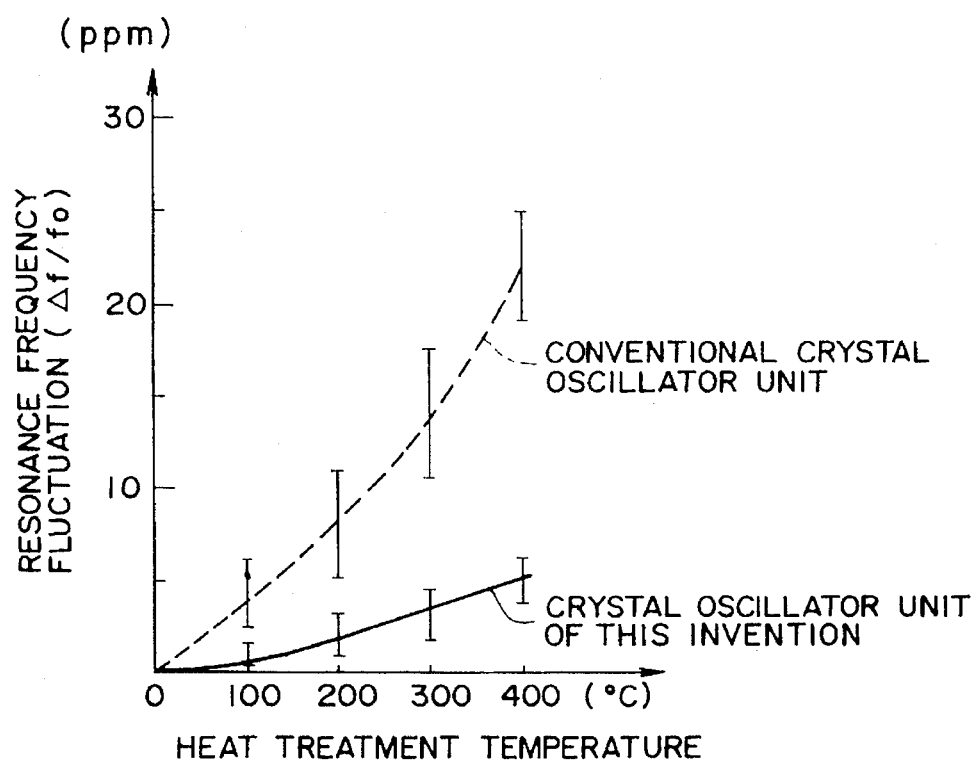
FIG. 4 is a diagram illustrative of a degree of influence which is caused by the temperature of heat treatment on the resonance frequency of the crystal oscillator units illustrated in FIGS. 1 and 3.

Results of measurement are depicted in FIG. 4. Results are also depicted in FIG. 4 as regards crystal oscillator units sealed in packages made principally of alumina according to prior art. This shows that the heat treatment resulted in a variation in the resonance frequency, which variation was about a quarter of that caused to prior-type manufactures.

Next, like packages 50 for crystal oscillator units were manufactured by using material powder listed in Table 1 and Table 2 as Example 2 or 2(A), Example 3 or 3(A), Example 4 or 4(A), Example 5 or 5(A), and Example 6 or 6(A) and in accordance with the processes specified in conjunction with Example 1 or 1(A). With a quartz piece 2 put in place, each crystal oscillator unit was completed. Evaluation was carried out on the dependency of the resonance frequency on the temperature of heat treatment of such crystal oscillator units in comparison with prior-art manufactures. The results were substantially similar to those made of composite materials of Examples 1 and 1(A) depicted in FIG. 4.

Figure 5:
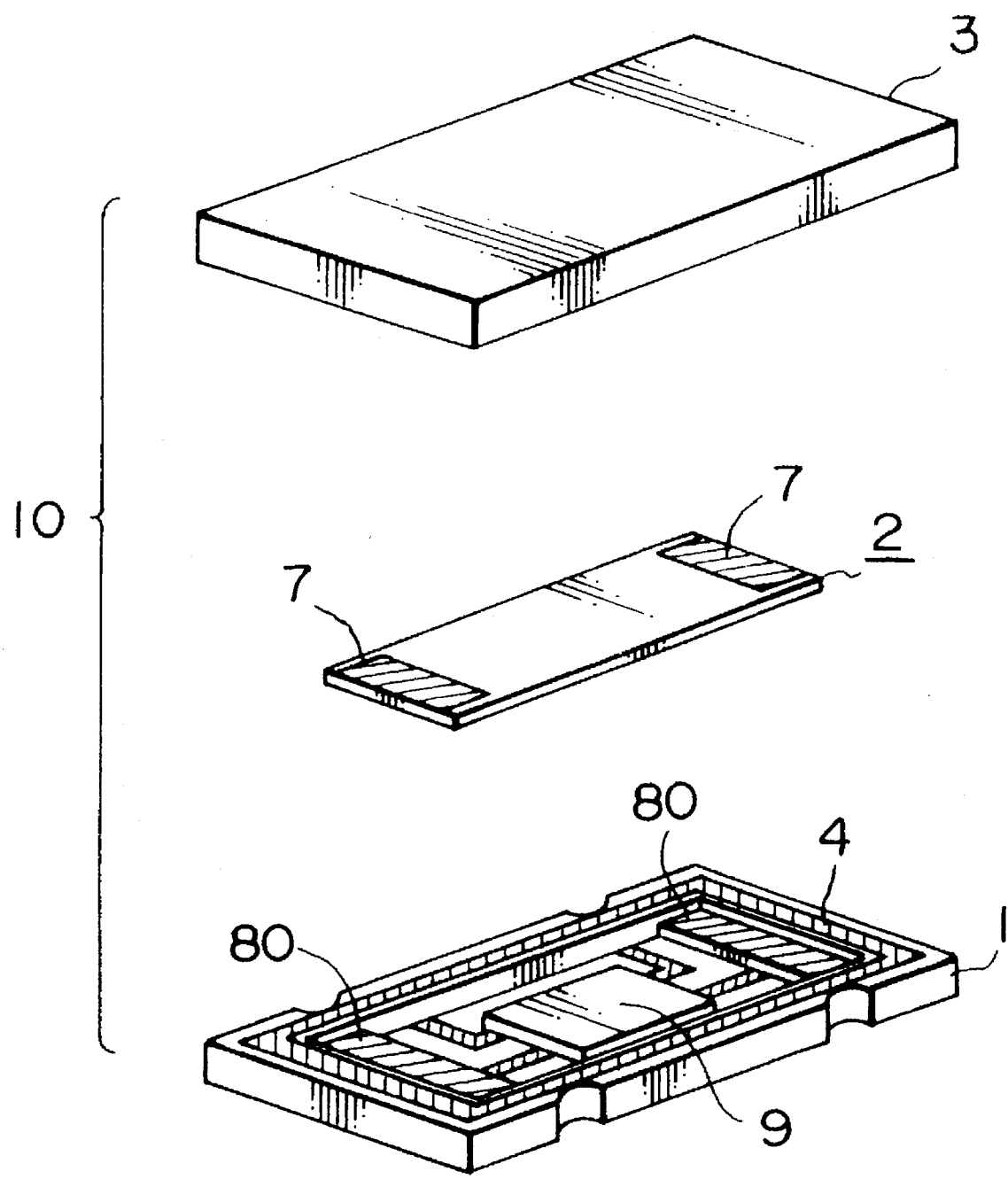
FIG. 5 is an exploded perspective view of a crystal oscillator unit according to a second embodiment of this invention.

Using material powder given in Example 1 or 1(A) of Table 1, packages 10 were manufactured for use as crystal oscillator units of a structure depicted in FIG. 5 as a second embodiment in accordance with the above-described processes. With an IC 9 for an oscillator circuit and the quartz piece 2 placed in each package 10, such crystal oscillator units were tested in comparison with prior-art manufactures as regards the dependency of its resonance frequency on the temperature of thermal treatment. Results were substantially similar to those described in connection with Examples 1 and (1A) depicted in FIG. 4.

Similar results were obtained when fine powder of $TiO_2$, $SnO_2$, $P_2O_5$, and $MoO_3$ was singly or jointly used in addition to fine powder of zirconia ($ZrO_2$) used in the above-described examples in the manner listed in Tables 1 and 2 as Examples 1(B) through 1(D), 2(B) through 2(D), 3(B) through 3(D), 4(B) through 4(D), 5(B) through 5(D), and 6(B) through 6(D). Preferably, the fine powder is given an average particle diameter between 0.1 and 1 micron. Results of evaluation are given in Tables 1 and 2.

Inasmuch as the thermal expansion coefficient of a piezoelectric oscillator piece, such as the quartz piece, matches the thermal expansion coefficient of the package, it is possible to make the crystal oscillator unit or the like have a frequency characteristic hardly susceptible to thermal treatment during and after seal of the piezoelectric oscillator piece in the package and to give a high reliability to the crystal oscillator units and other piezoelectric devices for surface mounting. It is possible to reduce the cost as well.

This invention is widely applicable to a package for a SAW resonator unit and a like piezoelectric device, besides the crystal oscillator unit, for surface mounting.

Moreover, it is no more necessary to use the resilient support member for absorbing the strain resulting from the thermal treatment. This makes it possible to give a thin thickness to the package.

Furthermore, it is possible to lower the temperature of sintering the package. This reduces the cost of manufacture. In addition, this renders it unnecessary to plate the electrode lead-out parts and thereby to shorten the hours of manufacture.

The package of this invention has a high bend breakage strength. Use of fine powder of the ceramics and the glass raises the bend breakage strength. Addition of the additive or additives further raises the bend breakage strength.

What is claimed is:

1. A flat packaged piezoelectric device comprising a base member, a pair of electrode pad parts formed on said base member, a piezoelectric oscillator piece consisting essentially of quartz, a pair of electrodes formed on both surfaces of said piezoelectric oscillator piece and having parts fixed to said electrode pad parts, and a cap member sealed air-tight to said base member to enclose said piezoelectric oscillator piece in cooperation with said base member, wherein each of said base and said cap members is made of a glass-ceramic composite material comprising a glass component, a ceramic component, and an additive, said glass-ceramic composite material having a thermal expansion coefficient which is between $100 \times 10^{-7}/°C.$ and $150 \times 10^{-7}/°C.$, both inclusive, said ceramic component being 30 to 70% by weight of forsterite ($2MgO.SiO_2$) which is dispersed in said glass component, said additive being an agent for providing seeds of crystallization of said glass-ceramic composite material.

2. A flat packaged piezoelectric device as claimed in claim 1, wherein said glass component consists, in percent by weight, essentially of 50 to 70% of $SiO_2$, 3 to 15% of $Al_2O_3$, 0 to 10% of ZnO, 0 to 8% of $B_2O_3$, 7 to 25% of at least one member of CaO, SrO, and BaO, and 13 to 27% of at least one member of $Na_2O$, $K_2O$, and $Li_2O$.

3. A flat packaged piezoelectric device as claimed in claim 2, wherein said glass component and said forsterite are pulverized to an average particle diameter of 1 to 3 microns, mixed together with addition of said additive formed of fine powder of an average particle diameter of 0.1 to 1 micron of 0 to 5% by weight of at least one member of $ZrO_2$, $TiO_2$, $SnO_2$, $P_2O_5$, and $MoO_3$, and sintered at a temperature between 800° C. and 1000° C.

4. A flat packaged piezoelectric device as claimed in claim 3, further comprising an oscillator integrated circuit connected to said electrodes and enclosed with said base and said cap members.

5. A flat packaged piezoelectric device comprising a base member, a pair of electrode pad parts formed on said base member, a piezoelectric oscillator piece, a pair of electrodes formed on both surfaces of said piezoelectric oscillator piece and having parts fixed to said electrode pad parts, and a cap member air-tight sealed to said base member to enclose said piezoelectric oscillator piece in cooperation with said base member, each of said base and said cap members being made of a glass-ceramic composite material comprising a glass component and a ceramic component, said glass component having a thermal expansion coefficient between $100 \times 10^{-7}/°C.$ and $150 \times 10^{-7}/°C.$, both inclusive, said ceramic component being 30 to 70% by weight of forsterite ($2MgO.SiO_2$) which is dispersed in said glass component, wherein said glass component consists, in percent by weight, essentially of 50 to 70% of $SiO_2$, 3 to 15% of $Al_2O_3$, 0 to 10% of ZnO, 0 to 8% of $B_2O_3$, 7 to 25% of at least one member of CaO, SrO, and BaO, and 13 to 27% of at least one member of $Na_2O$, $K_2O$, and $Li_2O$.

6. A flat packaged piezoelectric device as claimed in claim 5, wherein said glass component and said forsterite are pulverized to an average particle diameter of 1 to 3 microns, mixed together with addition of fine powder of an average particle diameter of 0.1 to 1 micron of 0 to 5% by weight of at least one member of $ZrO_2$, $TiO_2$, $SnO_2$, $P_2O_5$, and $MoO_3$, and sintered at a temperature between 800° C. and 1000° C.

7. A flat packaged piezoelectric device as claimed in claim 5, further comprising an oscillator integrated circuit connected to said electrodes and enclosed with said base and said cap members.

\* \* \* \* \*